United States Patent
Schurhoff

(10) Patent No.: US 9,995,178 B2
(45) Date of Patent: Jun. 12, 2018

(54) TURBOMACHINE COMPONENT WITH A PARTING JOINT, AND A STEAM TURBINE COMPRISING SAID TURBOMACHINE COMPONENT

(71) Applicant: Siemens Aktiengesellschaft, Munich (DE)

(72) Inventor: Jorg Schurhoff, Mulheim a.d. Ruhr (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 552 days.

(21) Appl. No.: 14/373,651

(22) PCT Filed: Nov. 7, 2012

(86) PCT No.: PCT/EP2012/071993
§ 371 (c)(1),
(2) Date: Jul. 22, 2014

(87) PCT Pub. No.: WO2013/113416
PCT Pub. Date: Aug. 8, 2013

(65) Prior Publication Data
US 2015/0030459 A1    Jan. 29, 2015

(30) Foreign Application Priority Data
Feb. 2, 2012  (EP) .................................... 12153626

(51) Int. Cl.
*F01D 25/24*    (2006.01)
*F01D 25/26*    (2006.01)
(Continued)

(52) U.S. Cl.
CPC .......... *F01D 25/24* (2013.01); *F01D 25/243* (2013.01); *F01D 25/265* (2013.01);
(Continued)

(58) Field of Classification Search
CPC ...... F01D 25/24; F01D 25/243; F01D 11/005; F04D 29/083; F04D 29/023;
(Continued)

(56) References Cited

U.S. PATENT DOCUMENTS 4,863,343 A * 9/1989 Smed ...................... F01D 9/042
                                                    415/138
5,079,100 A * 1/1992 Descamp ............... C25D 13/02
                                                     175/65
(Continued)

FOREIGN PATENT DOCUMENTS

CN         101248284 A    8/2008
EP         2410137 A1     1/2012
(Continued)

*Primary Examiner* — Igor Kershteyn
*Assistant Examiner* — Brian P Wolcott
(74) *Attorney, Agent, or Firm* — Beusse Wolter Sanks & Maire

(57) ABSTRACT

A turbomachine component is provided having at least two sub-components that are separated by a parting joint and each have a sealing surface at the parting joint, at least one of the two sealing surfaces being convex in order to form a linear contact of the two sealing surfaces. At least one of the sealing surfaces has a coating on it which includes a hard material, is a maximum of 30 μm thick and is applied using a vapour deposition method, or a coating which includes a chrome-containing alloy, is a maximum of 30 μm thick and is applied by a vapour deposition method, or is a maximum of 300 μm thick and applied using a thermal spraying method.

20 Claims, 1 Drawing Sheet

(51) Int. Cl.
*F04D 29/40* (2006.01)
*F04D 29/08* (2006.01)
*F04D 29/02* (2006.01)
*C23C 14/00* (2006.01)
*C23C 4/06* (2016.01)
*C23C 4/08* (2016.01)
*F16L 9/22* (2006.01)
*C23C 24/04* (2006.01)
*C23C 30/00* (2006.01)

(52) U.S. Cl.
CPC ......... *F04D 29/023* (2013.01); *F04D 29/083* (2013.01); *F04D 29/403* (2013.01); *C23C 4/06* (2013.01); *C23C 4/08* (2013.01); *C23C 14/00* (2013.01); *C23C 24/04* (2013.01); *C23C 30/005* (2013.01); *F05D 2230/311* (2013.01); *F05D 2230/313* (2013.01); *F05D 2230/314* (2013.01); *F05D 2230/90* (2013.01); *F05D 2240/55* (2013.01); *F05D 2300/132* (2013.01); *F05D 2300/17* (2013.01); *F05D 2300/22* (2013.01); *F16L 9/22* (2013.01)

(58) Field of Classification Search
CPC ............... F04D 29/403; F05D 2300/22; F05D 2300/132; F05D 2300/17; F05D 2230/313; F05D 2230/314; F05D 2230/90; F05D 2230/311; F05D 2240/55
See application file for complete search history.

(56) References Cited

U.S. PATENT DOCUMENTS

| | | | |
|---|---|---|---|
| 5,511,941 | A | 4/1996 | Brandon |
| 7,614,849 | B2 * | 11/2009 | Schmitz ................ C23C 28/347 415/200 |
| 7,823,889 | B2 | 11/2010 | Komukai et al. |
| 8,118,561 | B2 | 2/2012 | Bruce et al. |
| 2007/0284828 | A1 | 12/2007 | Iguchi |

FOREIGN PATENT DOCUMENTS

| | | | | |
|---|---|---|---|---|
| JP | S5783609 | A | | 5/1982 |
| JP | 285593 | A | | 3/1990 |
| JP | H1089011 | A * | 4/1998 | ............ F01D 25/24 |
| JP | H1089011 | A | | 4/1998 |
| JP | 2002047557 | A | | 2/2002 |
| JP | 2004027289 | A | | 1/2004 |
| JP | 2004149915 | A | | 5/2004 |
| JP | 2004232499 | A | | 8/2004 |
| JP | 2005016324 | A | | 1/2005 |
| JP | 2007514094 | A | | 5/2007 |
| JP | 2011085065 | A | | 4/2011 |
| JP | 2012501386 | A | | 1/2012 |
| WO | WO 0146324 | A2 * | 6/2001 | ............ C08J 7/045 |
| WO | 2006038328 | A1 | | 4/2006 |
| WO | 2010026077 | A1 | | 3/2010 |

* cited by examiner

TURBOMACHINE COMPONENT WITH A PARTING JOINT, AND A STEAM TURBINE COMPRISING SAID TURBOMACHINE COMPONENT

CROSS REFERENCE TO RELATED APPLICATIONS

This application is the US National Stage of International Application No. PCT/EP2012/071993 filed Nov. 7, 2012, and claims the benefit thereof. The International Application claims the benefit of European Application No. EP12153626 filed Feb. 2, 2012. All of the applications are incorporated by reference herein in their entirety.

FIELD OF INVENTION

The invention relates to a turbomachine component with a parting joint, and a steam turbine comprising said turbomachine component.

BACKGROUND OF INVENTION

A turbomachine, such as a steam turbine, has a housing within which a rotor of the steam turbine is mounted. In order that the housing can be opened, for example in order to remove the rotor from the housing, it has a horizontal parting joint such that the housing is divided in two, into a lower part and an upper part. In order to prevent leakage of the steam at the parting joint, it is necessary to provide sealing surfaces at the parting joint, both on the lower part and on the upper part, between which for example a sealing ring is inserted. By providing a flange, the lower part and the upper part can be screwed together and a predetermined contact pressure between the sealing surfaces can be generated.

When the steam turbine is in operation, the sealing surfaces are subjected to wear processes, such as erosion corrosion and stresses due to pressure and temperature gradients. Furthermore, vibration phenomena during operation of the steam turbine can lead to a relative movement between the lower part and the upper part, which can give rise to frictional corrosion on the sealing surfaces. The wear and/or the corrosion of the sealing surfaces leads to a reduction in sealing capability, such that in the end leakage of the steam can occur. Conventionally, both the lower part and the upper part are made of high-alloy steel, which is therefore expensive, in order to withstand the wear processes and in order to achieve a high strength of the lower part and of the upper part.

SUMMARY OF INVENTION

It is an object of the invention to propose a turbomachine component having sealing surfaces which are in linear contact with one another and a steam turbine having the turbomachine component which is cost-effective to manufacture.

The turbomachine component according to aspects of the invention has at least two sub-components which are separated by a parting joint and have in each case a sealing surface at the parting joint, wherein at least one of the two sealing surfaces is crowned, so as to form a linear contact between the two sealing surfaces, and wherein at least one of the sealing surfaces is provided with a coating which has a hard material, is at most 30 μm thick and which is applied by a gas phase deposition method, or a coating which has a chromium-containing alloy, which is at most 30 μm thick and is applied by a gas phase deposition method or which is at most 300 μm thick and is applied by a thermal spraying method.

According to aspects of the invention, the coating is formed such that it is not porous. Furthermore, no additional lubricating film is arranged between the coating and the sub-component.

The parting joint is formed wherever two sub-components of the turbomachine component are in contact with one another. This can be the case for example in the case of a housing which is split in two, it is also conceivable that the parting joint is formed between a guide vane support and the housing. The turbomachine component has the coating which is chemically resistant and which withstands wear and/or erosion, whereby it is advantageously not necessary to manufacture the entire turbomachine component from a material which is chemically resistant and which withstands wear and/or erosion, as a consequence of which the turbomachine component is cost-effective to manufacture. The combination of the chosen coating method, the associated coating material and the indicated layer thicknesses leads to good bonding of the coating to the turbomachine component, as a consequence of which the coating for the sealing surfaces which are in linear contact with one another is of sufficient strength.

The chromium fraction in the alloy is preferably greater than 10% by mass, in particular between 15 and 25% by mass. It is further preferred that the alloy comprises nickel, in particular 75 to 85% by mass of nickel.

The coating which is to be applied by the thermal spraying method preferably comprises particles of an additional hard material. The resistance of the coating to frictional wear is thus advantageously increased. The particles are preferably ceramic particles. The additional hard material preferably comprises a carbide, in particular tungsten carbide, titanium carbide and/or chromium carbide. The additional hard material preferably has a proportion by mass of 70 to 80% by mass in the coating. The thermal spraying method is preferably high velocity oxygen fuel spraying, cold gas spraying or detonation spraying.

The hard material preferably comprises a nitride, in particular chromium nitride, titanium nitride, titanium aluminum nitride or a boride, in particular titanium boride. The gas phase deposition method is preferably a method from the group PVD (physical vapor deposition) or CVD (chemical vapor deposition). The gas phase deposition methods are particularly suited for small turbomachine components.

The steam turbine according to the invention has a split steam turbine housing, which is the turbomachine component. The steam turbine housing has, on its parting joint, the sealing surfaces having the coatings, whereby the sealing surfaces are chemically resistant and able to withstand frictional wear.

By virtue of the provision of the coatings, it is advantageously not necessary to manufacture the entire steam turbine housing from a high-alloy and expensive material.

BRIEF DESCRIPTION OF THE DRAWINGS

A preferred embodiment of the turbomachine component according to the invention will be illustrated below with reference to the appended schematic drawings, in which.

DETAILED DESCRIPTION OF INVENTION

Figure 1:
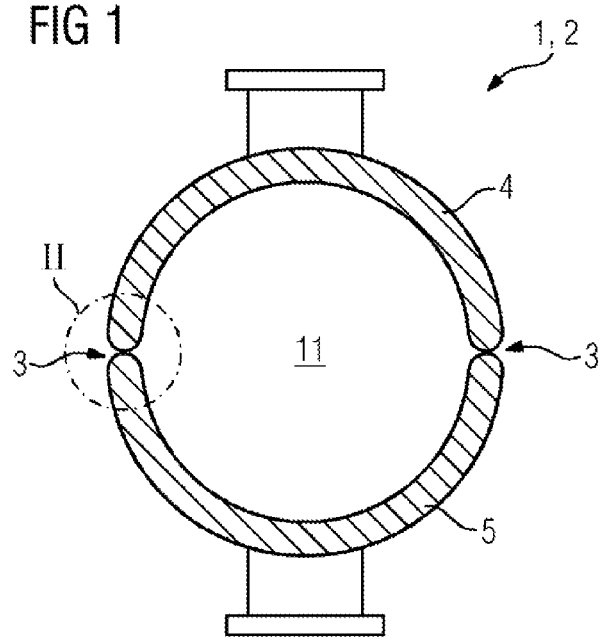
FIG. 1 shows a cross section through a housing of a turbomachine having a parting joint and a detailed view II of the parting joint.

As shown in FIG. 1, a steam turbine 1, as a turbomachine, has a housing 2 as a turbomachine component. A fluid 11, in particular steam, can be made to flow within the housing 2. The housing 2 has a horizontally arranged parting joint 3 which splits the housing 2 into a first sub-component 4 and a second sub-component 5. At the parting joint 3, the first sub-component 4 has a first sealing surface 6 and the second sub-component 5 has a second sealing surface 7. Both sealing surfaces 6, 7 are of convex shape, such that the sealing surfaces 6, 7 are crowned. In the assembled state of the housing 2, the sealing surfaces 6, 7 form a contact line 8 at those points at which they abut against one another. Forming the contact line 8 prevents the fluid 11 from escaping from the housing 2.

In the steam turbine 1, the sealing surfaces 6, 7 may be exposed to erosion corrosion. If, when the steam turbine 1 is in operation, vibrations arise, the sealing surfaces 6, 7 may be moved relative to each other, whereby abrasion and/or frictional corrosion can occur at the sealing surfaces 6, 7. Both corrosion types lead to wear of the sealing surfaces 6, 7, such that the fluid 11 can escape from the housing 2.

Figure 2:
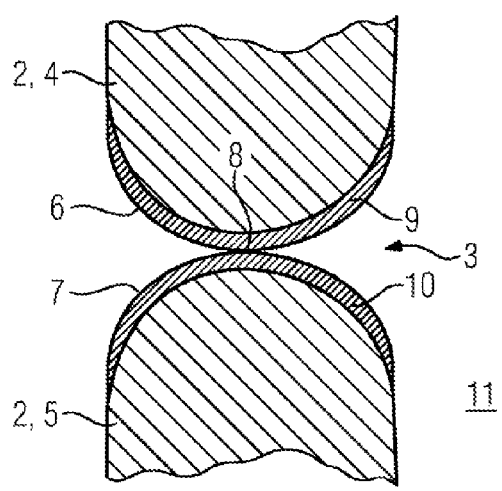
FIG. 2 shows the detailed view II from FIG. 1.

FIG. 2 shows that a first coating 9 is applied to the first sealing surface 6 and a second coating 10 is applied to the second sealing surface 7. In the case that the coatings 9, 10 are a thermal spray layer, the coatings 9, 10 are at most 300 μm thick. In the case that the coatings 9, 10 are applied by a gas phase deposition method, the coatings 9, 10 are at most 30 μm thick.

For example, the coatings 9, 10 could be 200 μm thick and be produced from an alloy which is 80% by mass nickel and 20% by mass chromium. The coatings 9, 10 are then applied to the sealing surfaces 6, 7 by cold gas spraying.

Alternatively, the coatings 9, 10 could be 250 μm thick and be produced from a matrix of an alloy which has 15% by mass chromium and 85% by mass nickel. Chromium carbide particles are introduced into the matrix, the particles representing 75% by mass of the coatings 9, 10. The coatings 9, 10 are applied to the sealing surfaces 6, 7 by high velocity oxygen fuel spraying.

In a further exemplary embodiment, the coatings 9, 10 are 20 μm thick and are produced from chromium nitride. In this case, the coatings 9, 10 are applied to the sealing surfaces 6, 7 by a physical vapor deposition method (PVD).

It is in principle also conceivable that the two sealing surfaces 6, 7 have different types of coatings or that just one of the two sealing surfaces 6, 7 is coated. The first sealing surface 6 has for example a 30 μm-thick coating 9 of titanium boride which is applied by a chemical vapor deposition method. The second sealing surface 7 has for example a 100 μm-thick layer of an alloy consisting of 85% by mass nickel and 15% by mass chromium, which is applied by detonation spraying.

In a departure from the embodiment of FIGS. 1 and 2, the contact line could equally be formed by, for example, the first sealing surface being flat and the second sealing surface being crowned. It is further conceivable that both sealing surfaces are flat and a sealing ring is arranged between the sealing surfaces, such that a contact line is formed between each of the sealing surfaces and the sealing ring.

Although the invention has been illustrated and described in more detail by means of the preferred exemplary embodiments, the invention is not restricted by the disclosed examples and other variations may be derived therefrom by a person skilled in the art without departing from the scope of protection of the invention.

The invention claimed is:

1. A turbomachine component, comprising:
   at least two sub-components which are separated by means of a parting joint and have in each case a sealing surface at the parting joint,
   wherein at least one of the two sealing surfaces is convex, such that in an assembled state of the two sub-components, the sealing surfaces form a contact line at those points at which they abut against one another so as to form a linear contact between the two sealing surfaces, and
   wherein at least one of the sealing surfaces is provided with a coating which has a hard material, is at most 30 μm thick and which is applied by a gas phase deposition method, or a coating which has a chromium-containing alloy, which is at most 30 μm thick and is applied by a gas phase deposition method, or a coating which is at most 300 μm thick and is applied by a thermal spraying method,
   wherein the coating is formed such that it is not porous; and
   wherein the turbomachine component is a split steam turbine housing.

2. The turbomachine component as claimed in claim 1, without an additional lubricating film between the coating and the sub-component.

3. The turbomachine component as claimed in claim 1, wherein the chromium fraction in the chromium-containing alloy is greater than 10% by mass.

4. The turbomachine component as claimed in claim 1, wherein the chromium-containing alloy comprises nickel.

5. The turbomachine component as claimed in claim 1, wherein the coating which is to be applied by the thermal spraying method comprises particles of an additional hard material.

6. The turbomachine component as claimed in claim 5, wherein the particles are ceramic particles.

7. The turbomachine component as claimed in claim 5, wherein the additional hard material comprises a carbide.

8. The turbomachine component as claimed in claim 5, wherein the additional hard material has a proportion by mass of 70 to 80% by mass in the coating.

9. The turbomachine component as claimed in claim 1, wherein the thermal spraying method is high velocity oxygen fuel spraying, cold gas spraying or detonation spraying.

10. The turbomachine component as claimed in claim 1, wherein the hard material comprises a nitride or a boride.

11. The turbomachine component as claimed in claim 1, wherein the gas phase deposition method is a method from the group PVD (physical vapor deposition) or CVD (chemical vapor deposition).

12. The turbomachine component as claimed in claim 3, wherein the chromium fraction in the chromium-containing alloy is between 15 and 25% by mass.

13. The turbomachine component as claimed in claim 4, wherein the chromium-containing alloy comprises 75 to 85% by mass of nickel.

14. The turbomachine component as claimed in claim 7, wherein the carbide comprises tungsten carbide, titanium carbide and/or chromium carbide.

15. The turbomachine component as claimed in claim 10, wherein the nitride comprises chromium nitride, titanium nitride, and/or titanium aluminum nitride.

16. The turbomachine component as claimed in claim 10, wherein the boride comprises titanium boride.

17. A turbomachine component, comprising:
a turbine housing comprising a lower part and an upper part, each part comprising a respective sealing surface, the sealing surfaces joined at a parting joint in an assembled state of the turbine housing;
wherein at least one of the sealing surfaces is convex, such that in the assembled state of the turbine housing, the sealing surfaces form a contact line at those points at which they abut against one another so as to form a linear contact between the two sealing surfaces;
wherein at least one of the sealing surfaces is provided with a coating material; and
wherein the coating material comprises a material which withstands wear and/or corrosion better than a material of construction of the turbine housing.

18. The turbomachine component of claim 17, wherein the coating material comprises greater than 10% by mass of chromium.

19. The turbomachine component of claim 17, wherein the coating material comprises 75-85% by mass of nickel.

20. The turbomachine component of claim 17, wherein the coating material comprises ceramic particles.

* * * * *